United States Patent [19]

Kriz

[11] Patent Number: 5,278,523
[45] Date of Patent: Jan. 11, 1994

[54] TEMPERATURE-STABLE TUNED-CIRCUIT OSCILLATOR, ESPECIALLY IN A PROXIMITY SWITCH

[75] Inventor: Dieter Kriz, Lüdenscheid, Fed. Rep. of Germany

[73] Assignee: Christian Lohse Beruhrungslose Schalttechnik, Ludenscheid, Fed. Rep. of Germany

[21] Appl. No.: 766,486
[22] PCT Filed: Jan. 11, 1990
[86] PCT No.: PCT/EP90/00058
  § 371 Date: Jul. 12, 1991
  § 102(e) Date: Jul. 12, 1991
[87] PCT Pub. No.: WO90/08429
  PCT Pub. Date: Jul. 26, 1990

[30] Foreign Application Priority Data

Jan. 13, 1989 [DE] Fed. Rep. of Germany ..... 39000802

[51] Int. Cl.[5] .......................... H03B 5/04; H03B 5/12; H03K 17/95; H03L 1/02
[52] U.S. Cl. ..................................... 331/176; 331/65; 331/117 R; 324/236; 324/327
[58] Field of Search ......... 331/66, 65, 117 R, 117 FE; 324/236, 327

[56] References Cited

U.S. PATENT DOCUMENTS 4,270,102  5/1981  Gawler et al. ................. 331/115
4,509,023  4/1985  Heimlicher ................... 331/66 X Primary Examiner—David Mis
Attorney, Agent, or Firm—Sprung Horn Kramer & Woods

[57] ABSTRACT

The invention relates to a temperature-stable transistorised tuned-circuit oscillator. Provided for the purpose of temperature stabilisation of the tuned-circuit voltage is a transistor T2, which is thermally coupled to the tuned-circuit coil L and controls a current source Q in the circuit of the oscillator L, C1, T1, in such a way that temperature-induced variations of the data of the tuned-circuit coil L are compensated.

4 Claims, 1 Drawing Sheet

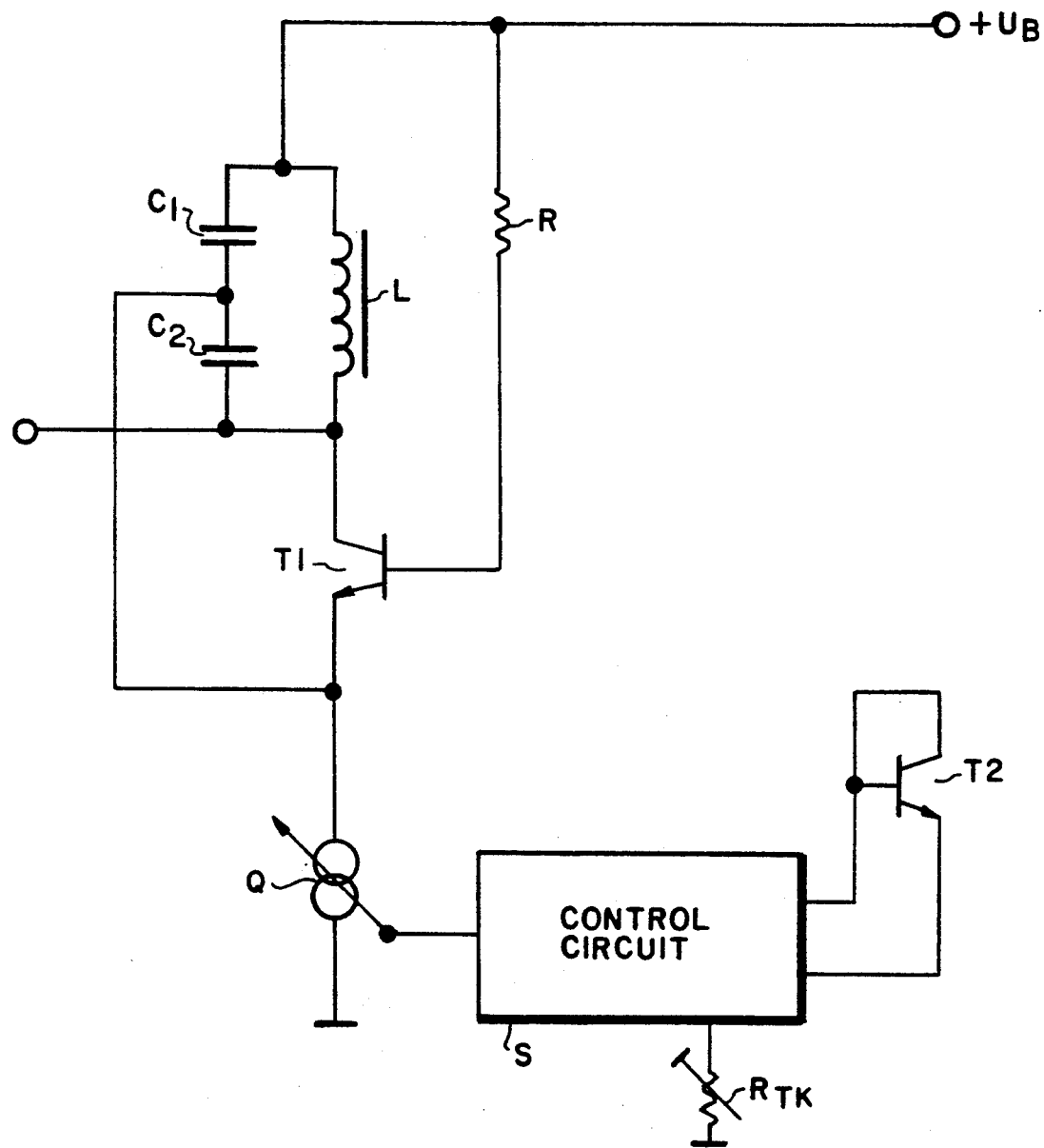

TEMPERATURE-STABLE TUNED-CIRCUIT OSCILLATOR, ESPECIALLY IN A PROXIMITY SWITCH

BACKGROUND OF THE INVENTION

1. Field of the Invention

The invention relates to a transistorized tuned-circuit oscillator, especially in a proximity switch, having a current source, which is arranged in the circuit of the tuned-circuit transistor, is controlled by a temperature sensor, which drives the current source high with rising temperature and vice versa in order to stabilize the tuned-circuit voltage.

2. Description of Related Art

It is known that the oscillation behaviour of tuned-circuit oscillators depends on the ambient temperature. Inductive proximity switches which have a tuned-circuit oscillator require a high sensitivity, because otherwise the switch does not react sufficiently precisely to small changes in position of the target to be detected. Owing to the temperature dependence of the tuned-circuit coil, there is a change in the resonant impedance of the tuned circuit, with the result that the switching points of the proximity switch are not temperature-stable. It has been attempted to compensate for this temperature dependence by means of a temperature-dependent resistor (NTC resistor) arranged in the feedback branch of the tuned-circuit transistor. Such a temperature compensation has a plurality of disadvantages:

a) Compensation by means of the temperature-dependent resistor is not optimum, because the temperature-dependent impedance characteristic of the tuned-circuit coil is linear, whereas the resistance characteristic of the temperature-dependent resistor obeys an e function.

b) At +/−20%, the initial tolerances of the temperature-dependent resistor are quite large, and its long-term stability is relatively poor.

c) The temperature-dependent resistor is situated in the RF-carrying feedback branch and therefore has to be arranged in the immediate vicinity of the tuned-circuit oscillator. Thermal coupling to the coil, which is the precondition for good temperature compensation, would therefore lead to resistor connecting leads too long for RF.

d) The generally customary trimming resistor for setting the switching interval, which is in series with the temperature-dependent resistor, influences the compensation effect of the temperature-dependent resistor.

e) Since the trimming resistor carries RF, it must likewise be arranged in the vicinity of the tuned-circuit oscillator. Consequently, it cannot be arranged with long connecting leads at the rear end of the tuned-circuit oscillator, which s constructed as a hybrid circuit, which would be favourable for simple laser trimming.

SUMMARY OF THE INVENTION

It is the object of the invention to create a tuned-circuit oscillator which with reference to the temperature compensation of the tuned-circuit coil is an improvement by comparison with conventional tuned-circuit oscillators.

This object is achieved in a tuned-circuit oscillator of the type mentioned at the beginning when the temperature sensor is a transistor thermally coupled to the tuned-circuit coil, the driving of the current source being performed by the transistor via a control device which matches to one another the linear gradients of the thermally coupled transistor and of the tuned-circuit coil. In this arrangement the transistor is preferably mounted directly on the tuned-circuit coil. Since the tuned-circuit coil generally has a core, the transistor is preferably mounted on the core, especially bonded on.

With the invention, no element for temperature compensation is situated in an RF-carrying branch. Consequently, the transistor, which operates as the sensor and is situated in a direct-current branch, can also be shifted as far as the coil by means of long connecting leads without disadvantages for the compensation. It is ensured in this way that the transistor and the tuned-circuit coil have the same temperature. Since a transistor has a linear characteristic in narrow tolerances and a good long-term stability with respect to its data, optimum temperature compensation of the tuned-circuit coil, which likewise has a linear characteristic, is ensured.

Any different gradients in the linear characteristics of the tuned-circuit coil and in the transistor mounted on it can be adjusted by means of a multiplier upstream of the current source, for example.

According to an advantageous embodiment of the invention, a resistor for the switching-interval compensation of the oscillator is assigned to the control circuit of the current source. Since, precisely like the transistor, this trimming resistor no longer carries RF, but carries direct current, it can be positioned using relatively long connecting leads at a site where it is particularly well placed for the compensation. This control circuit contains the multiplier for adjusting the linear characteristics. The adjustment can be performed at the resistor for the switching-interval compensation.

Overall, the invention yields an improved temperature compensation, with the result that an inductive proximity switch which comprises the tuned-circuit oscillator according to the invention has an improved switching-interval stability.

The invention is explained below in more detail with reference to the drawing.

BRIEF DESCRIPTION OF THE DRAWING

The single figure of the drawing is a circuit diagram representing a tuned-circuit oscillator for an inductive proximity switch in accordance with the invention.

DESCRIPTION OF THE PREFERRED EMBODIMENT

Referring to the single figure, connected to a direct-current voltage source $U_B$ is a series circuit consisting of a tuned circuit having a tuned-circuit transistor T1 and a controllable current source Q. The tuned-circuit transistor T1 operated in common base in fed back. The base of the tuned-circuit transistor T1 is connected via a resistor R to the direct-current voltage source $U_B$. The tuned circuit L, C1, C2 and the fed-back tuned-circuit transistor T1 form the oscillator.

A controllable current source Q is connected in series with the collector-emitter section of the tuned-circuit transistor T1. Provided for the purpose of controlling the current source Q is a control device S which controls the current souree Q as a function of the setting of a trimming resistor $R_{TK}$. The control signal for the current source Q depends further on the signal of a temperature sensor which is constructed as the transistor T2. The transistor T2 is bonded on the core of the tuned-circuit coil L in such a way that it also experiences the temperature variations of the tuned-circuit coil L. The control device S serves to adjust the generally different gradients of the current characteristics, which depend on the temperature, of the tuned-circuit circuit coil L and the transistor T2. By setting the trimming resistor $R_{TK}$, the control effect of the transistor T2 can be set such that an absolute temperature compensation is achieved.

The function of the temperature-stable tuned-circuit oscillator is as follows:

The oscillator is set such that at normal temperature it oscillates without damping due to a metallic target. When the oscillator is oscillating, the oscillator voltage can be tapped at the output and evaluated for switching functions using the evaluation circuit. The quality of the tuned circuit L, C1, C2 varies as a function of a metallic target introduced into the vicinity of the tuned-circuit coil L, so that the oscillator ceases to oscillate at a specific distance from the metallic target. This behaviour would be temperature-dependent were not the special temperature compensation provided for the tuned-circuit coil L. If, for example, the AC component of the tuned-circuit current decreases as the result of a temperature increase, this reduction in the tuned-circuit current is opposed due to the fact that a signal is passed via the transistor T2 to the control circuit S which opens the current source Q further, so that the switching interval remains constant as a result in the case of a temperature increase owing to a variation, imposed by the current source Q, in the current flowing through the coil L. The tuned-circuit voltage tapped at the output of the tuned circuit thereby also remains constant.

There has thus been shown and described a novel temperature-stable tuned-circuit oscillator which fulfills all the objects and advantages sought therefor. Many changes, modifications, variations and other uses and applications of the subject invention will, however, become apparent to those skilled in the art after considering this specification and the accompanying drawing which discloses the preferred embodiment thereof. All such changes, modifications, variations and other uses and applications which do not depart from the spirit and scope of the invention are deemed to be covered by the invention, which is to be limited only by the claims which follow.

I claim:

1. In a transistorized tuned-circuit oscillator having a current source (Q), which is arranged in a circuit of a tuned-circuit transistor (T1), is controlled by a temperature sensor, which drives the current source (Q) high with rising temperature and vice versa in order to stabilize the tuned-circuit voltage, the improvement wherein the temperature sensor is a transistor (T1) thermally coupled to a tuned-circuit coil( L), the driving of the current source (Q) being performed by said transistor (T1) via a control circuit (S) which matches to one another the linear gradients of the thermally coupled transistor (T2) and of the tuned-circuit coil (L).

2. Tuned-circuit oscillator according to claim 1, wherein the transistor (T2) is mounted directly on the tuned-circuit coil (L).

3. Tuned-circuit oscillator according to claim 1 wherein the tuned-circuit coil (L) having a core the transistor (T2) is mounted on the core.

4. Proximity switch having a tuned-circuit oscillator according to claim 1, wherein a resistor ($R_{TK}$) for the switching-interval compensation of the oscillator is included in the control circuit (S) of the current source (Q).

* * * * *